United States Patent
Gambarov et al.

(10) Patent No.: US 9,223,904 B2
(45) Date of Patent: Dec. 29, 2015

(54) CORRECTION OF TOPOLOGY INTERFERENCE FOR SOLID OBJECTS IN A MODELING ENVIRONMENT

(75) Inventors: Alex Gambarov, Sherborn, MA (US); Stanislav Berdichevsky, Wayland, MA (US); Sergey Grishechkin, Holliston, MA (US); Dmitriy Bogaevsky, Acton, MA (US); Vitali Liberman, Chestnut Hill, MA (US); Ivan Smyshlyayev, Bellingham, MA (US); Boris Kruk, Allston, MA (US); Herman Ponyrko, Ashland, MA (US); Anton Tsypkin, Sharon, MA (US)

(73) Assignee: PTC Inc., Needham, MA (US)

(*) Notice: Subject to any disclaimer, the term of this patent is extended or adjusted under 35 U.S.C. 154(b) by 550 days.

(21) Appl. No.: 12/794,923

(22) Filed: Jun. 7, 2010

(65) Prior Publication Data
US 2011/0102431 A1 May 5, 2011

Related U.S. Application Data

(60) Provisional application No. 61/185,046, filed on Jun. 8, 2009.

(51) Int. Cl.
*G06F 17/50* (2006.01)
*G06T 19/20* (2011.01)

(52) U.S. Cl.
CPC ............... *G06F 17/50* (2013.01); *G06T 19/20* (2013.01); *G06T 2219/2021* (2013.01)

(58) Field of Classification Search
CPC .. G06T 19/20; G06T 2219/2021; G06T 17/10
See application file for complete search history.

(56) References Cited

U.S. PATENT DOCUMENTS

| | | |
|---|---|---|
| 2003/0114947 A1 | 6/2003 | Tanaguchi |
| 2004/0174362 A1 | 9/2004 | Celniker |
| 2007/0265727 A1* | 11/2007 | Bae et al. ..................... 700/182 |

FOREIGN PATENT DOCUMENTS

EP    1276077 A2    1/2003

OTHER PUBLICATIONS

Kristen Kurland, "3D Tutorials AutoCAD 2007," published online in 2007. Achived on Oct. 11, 2007. Retreived from http://web.archive.org/web/20071014001257/http://www.andrew.cmu.edu/course/48-568/ on May 2, 2013.*

(Continued)

*Primary Examiner* — Zhengxi Liu
(74) *Attorney, Agent, or Firm* — Nelson Mullins Riley & Scarborough LLP

(57) ABSTRACT

The present invention provides a method, system, and instructions stored on a computer readable storage medium that resolve interference between surfaces in a modeling environment, such as a CAD environment. Further, exemplary embodiments of the present invention may modify the surfaces of a model to ensure that parts of the model constitute a solid body. In exemplary embodiments, when the manipulation of a first surface or set of surfaces causes interference with a second surface or set of surfaces, the topologies of the surfaces are modified to account for the interference. The individual surfaces involved in the intersection may be treated as a merged surface or set of surfaces having a single topology, surface area, and volume. If an ambiguity arises whereby more than one option exists for resolving the interference or providing a solid body, the modeling environment may provide multiple potential solutions to a user, and allow the user to select from among the solutions.

8 Claims, 6 Drawing Sheets

(56) References Cited

OTHER PUBLICATIONS

M. C. Lin, D. Manocha, J. Cohen, and S. Gottschalk, "Collision detection: Algorithms and applications," in Algorithms for Robotic Motion and Manipulation, J.-P. Laumond and M. Overmars, Eds. Wellesley, MA: A. K. Peters, 1997, pp. 129-142.*
"Undoing" http://docs.gimp.org/en/gimp-concepts-undo.html. Archived on Jan. 11, 2006. Retrieved on Sep. 26, 2013 from <http://web.archive.org/web/20060111160535/http://docs.gimp.org/en/gimp-concepts-undo.html>.*
Johnson, Steve. Microsoft Office PowerPoint 2003. Que Publishing, 2003. (p. 116).*
Einstieg, "Allplan 2004 Architektur Handbuch," Excerpt from Chapter 5, p. 222-230 (2004).
Modellieren 3D, ALLPLOT Version 12, Handbuch Ingenieurbau Teil 8, Nemetschek, Programmsystem GmbH, Munchen, Germany, pp. 1.01-2.30 (1996).
International Preliminary Report on Patentability for Application No. PCT/US2010/037756, dated Aug. 19, 2011.
Japanese Office Action for Application No. 2012-515059, 5 pages, dated Oct. 11, 2013.
Chinese Office Action for Application No. 201080035071.5, 24 pages, dated Dec. 26, 2013.
International Search Report for Application No. PCT/US2010/037756, 3 pages, dated Sep. 29, 2010.
Japanese Office Action for Application No. 2012-515059, 3 pages, dated May 19, 2014.

* cited by examiner

US 9,223,904 B2

CORRECTION OF TOPOLOGY INTERFERENCE FOR SOLID OBJECTS IN A MODELING ENVIRONMENT

RELATED APPLICATION

This application claims the benefit of U.S. Provisional Patent Application No. 61/185,046, filed on Jun. 8, 2009, for all subject matter common to said applications. The disclosures of all of the above-mentioned applications are hereby incorporated by reference herein in their entirety.

FIELD OF THE INVENTION

The present invention is generally directed to the correction of topology inference in modeling environments, and in particular Computer Aided Drafting ("CAD") environments.

BACKGROUND OF THE INVENTION

In modeling environment such as CAD environments, a user may construct a model by specifying a number of rules that define the geometry of the model. The geometry that makes up the model is composed of set of "surfaces" connected to each other through "edges." A solid body is formed when every edge has at least two adjacent surfaces attached to it. For example, a cube is a solid body because each edge includes at least two adjacent surfaces. An example of non-solid body is a piece of paper, where each of four edges are attached to a single surface. A geometry may represent a component of a model, which can take a wide variety of shapes or sizes. For example, a model of a computer mouse may include a cylindrical geometry having a number of surfaces that represents the mouse wheel, flat rectangular geometries representing the mouse buttons, and a spherical geometry representing a trackball.

In many modeling environments, geometries and their corresponding surfaces may be moved relative to each other in three-dimensional space. This may allow, for example, a user to create a set of surfaces representing a button on a mouse, and then experiment with different button placements in order to achieve an ergonomically beneficial design. When a geometry, surface, or set of surfaces can be moved instead of being restricted to the place in which it was defined, this is an example of "flexible modeling."

However, a problem arises in flexible modeling environments when the movement of a surface causes the surfaces of a solid body to interfere with other surfaces of the solid body. In the above example, the movement of a mouse button might mean that a part of the mouse button would occupy space that is already occupied by the geometry corresponding to the mouse wheel. Accordingly, modeling environments may restrict the ability of a user to move specific surfaces into a new location if moving the surfaces would cause them to interfere with another surface. This restriction prevents two different sets of surfaces or geometries from occupying the same space at the same time.

Such a restriction is not always desirable. For example, a user may create a geometry that the user later wishes to integrate with some other geometry. This may require the user to eliminate the individual geometries and reconstruct a new, third geometry that represents the integration of the first and second geometries. This process can be time-consuming and complicated.

Additionally, modeling environments are often used to develop or prototype an object before the object is manufactured. The design that results from the modeling environment may be used as a blueprint for a manufacturer, or the model itself may serve as an input to a rapid prototyping machine.

In order to effectively serve as a basis for a manufactured object, the model in the modeling environment should fulfill certain considerations or meet certain requirements. One exemplary requirement is that the model must represent a solid body. Such a rule is a key requirement for proper reconstruction of a solid geometry after Flexible Modeling operation is performed.

Another exemplary requirement is that the surfaces of a particular model should be as coextensive as possible. In the manufacturing or prototyping process, it is desirable for the faces of certain parts of manufactured objects to be as coextensive as possible. This reduces the manufacturing complexity and costs while simultaneously improving the structural integrity of the manufactured object. For example, a user in a CAD environment may move a first set of surfaces close to a second set of surfaces with the intention that two of the surfaces meet (e.g., moving two cubes together to form a rectangle). However, a gap may exist between the surfaces that is difficult to see in the modeling environment, resulting in surfaces that are not coextensive.

Therefore, there is a need for a modeling environment that is capable of resolving interference between geometries and surfaces in a modeling environment that allows the model to form a unitary solid body. Further, there is a need for a modeling environment with the ability to ensure that surfaces in a model are as coextensive as possible, if desired.

SUMMARY OF THE INVENTION

The present invention provides a method, system, and instructions stored on a computer readable storage medium that properly resolve interference between sets of surfaces in a modeling environment, such as a CAD environment. Further, exemplary embodiments of the present invention may modify the surfaces of a model to ensure that parts of the model constitute a solid body.

In accordance with one embodiment of the present invention, a model is provided in a modeling environment. The model may include one or more geometries that may be manipulated in the modeling environment. The one or more geometries may define a set of surfaces. The manipulation may include, for example, moving or resizing the surfaces. When a geometry is manipulated in such a way that the manipulation causes interference with another geometry, aspect of the geometry, or surface, the topology of the model is modified to account for the interference.

The modification of the topology may include a number of changes. For example, new edges or vertices may need to be created, or old edges or vertices may need to be removed (or both). Self intersections may be resolved so that intersecting surfaces form a single, solid body. Further, the boundaries of surfaces involved in the modification may be extended or reduced in order to form a solid body.

In modifying the topology, an ambiguity may arise whereby more than one option exists for the new topology. In the case of an ambiguity, the environment may provide multiple potential solutions to a user, and allow the user to select from among the solutions.

DESCRIPTION OF THE FIGURES

Exemplary embodiments of the invention are described with reference to the following figures. Throughout the figures, like reference numerals describe like elements.

DETAILED DESCRIPTION

The present invention provides a method, system, and instructions stored on a computer readable storage medium that resolve interference between features in a modeling environment, such as a CAD environment. Further, exemplary embodiments of the present invention may modify the surfaces of a model to ensure that parts of the model constitute a solid body.

As used herein, a "surface" is a face defined by a particular geometry in the model. A geometry may have one or more surfaces or sets of surfaces. The surfaces may be flat, curved, or angular. For example, a cube has six flat surfaces. A cylinder has flat, circular top and bottom surfaces and a single curved side surface. A cone has a flat, circular bottom surface and a round, tapering, angular side surface that comes to a point at the top of the cone.

As used herein, an "edge" represents the outer boundary of a surface. For example, the front surface of a cube has four edges equal in size and oriented at right angles to each other. As used herein, a "vertex" is a point at which two or more edges meet. On a cube, vertices are located at each corner, where three edges meet.

As used herein, "topology" is the representation of the surface area of a solid body. The topology is comprised by interconnecting surfaces, edges, and vertices. In certain circumstances it is very useful to accurately represent the topology of a model, for example to allow the model to undergo rapid prototyping.

Figure 1:
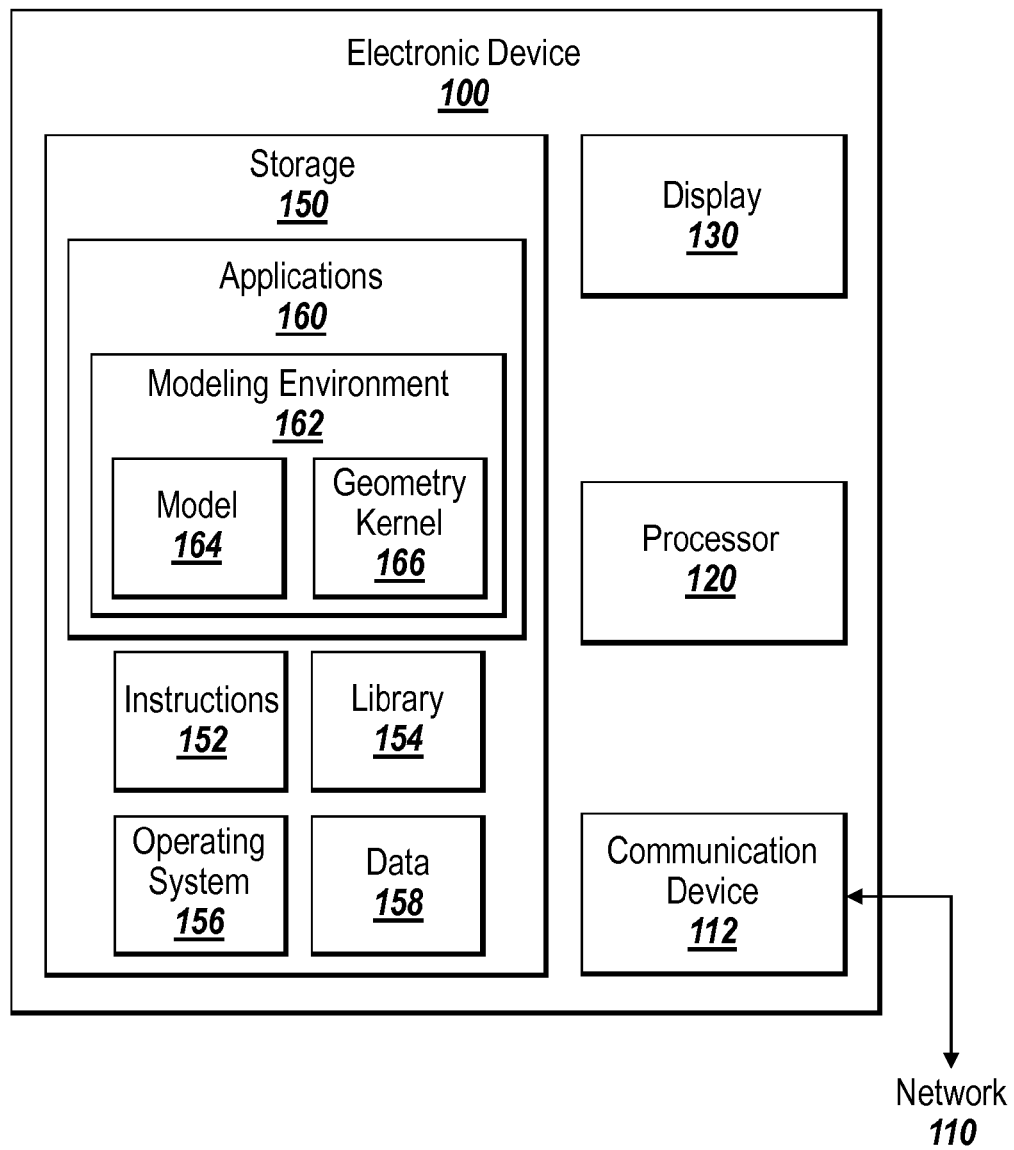
FIG. 1 depicts an exemplary electronic device 100 suitable for use with exemplary embodiments of the invention.

FIG. 1 depicts an electronic device 100, e.g. a computer, suitable for use with the exemplary embodiments described herein. The electronic device 100 may contain storage 150 for storing computer-executable instructions 152 to be executed by a processor 120, such as a microprocessor, application specific integrated circuit (ASIC), field-programmable gate array (FPGA), or a controller. The instructions 152 may be embodied in one or more computer-readable media, and may implement the functionality of exemplary embodiments described herein. The media may be, but are not limited to, a hard disk, a compact disc, a digital versatile disc, a flash memory card, a programmable read only memory (PROM), a random access memory (RAM), a read only memory (ROM), magnetoresistive random access memory (MRAM), magnetic storage media, or optical storage media. The instructions 152 may cause the processor 120 to perform a series of steps described in detail below. The instructions 152 may be in any form that describes how to perform these steps. For example, the instructions may be uncompiled code in any suitable programming language, compiled code, assembly language instructions, or any other type of instructions.

The storage 150 may store any modules, outputs, displays, files, information, user interfaces, etc, provided in exemplary embodiments. The storage 150 may store applications 160 for use by the electronic device 100 or another electronic device. The applications 160 may include programs, modules, or software components that allow the electronic device 100 to perform tasks. Examples of applications 160 include word processing software, shells, Internet browsers, productivity suites, and programming software. In one embodiment, the electronic device 100 may include a modeling environment 162 for constructing models. The modeling environment 162 may be, for example, a software component or a computer program. The modeling environment 162 may be a CAD environment. The modeling environment 162 may include means for constructing, editing, saving and loading models, simulating the performance of a model, and providing the model as an input to a rapid prototyping or manufacturing unit. The modeling environment 162 may further include a geometry kernel 164, which calculates and represents the geometry of features in the model. For example, the geometry kernel 164 may be responsible for calculating the topology of the model.

The storage 150 may also store an operating system 156 for operating the electronic device 100. The storage 150 may store additional applications 160 for providing additional functionality, as well as data 158 for use by the electronic device 100 or another device. The data 158 may include files, variables, parameters, images, text, and other forms of data. The storage 150 may also store a library 154, such as a library for storing models used by the modeling environment 162. The library 154 may be used, for example, to store default or custom models or model components.

The electronic device 100 may have a communication device 112 for communicating with a communication network 110. The communication device 112 may be, for example, a modem, an Ethernet connection, a fiber optic connection, a radio antenna, or any suitable means for communicating with a network. Examples of communication networks include, but are not limited to, the Internet, Ethernet networks, Fiber Optic Networks, WiFi networks, UMTS terrestrial radio access network (UTRAN) or universal mobile telecommunications System (UMTS) networks, code division multiple access (CDMA) networks, WiMax Networks, and ultra mobile broadband (UMB) networks, among others.

Optionally, the electronic device 100 may have a display device 130 for displaying any outputs, displays, files, information, user interfaces, etc, provided in exemplary embodiments. The display device 130 may display a Graphical User Interface (GUI). The display device 130 may be, for example, a computer monitor, television, touch screen, tablet or slate computer, or any other device capable of displaying information.

It is understood that the present invention may be implemented in a distributed or networked environment. For example, models may be provided and manipulated at a central server, while a user interacts with the models through a user terminal.

Figure 2:
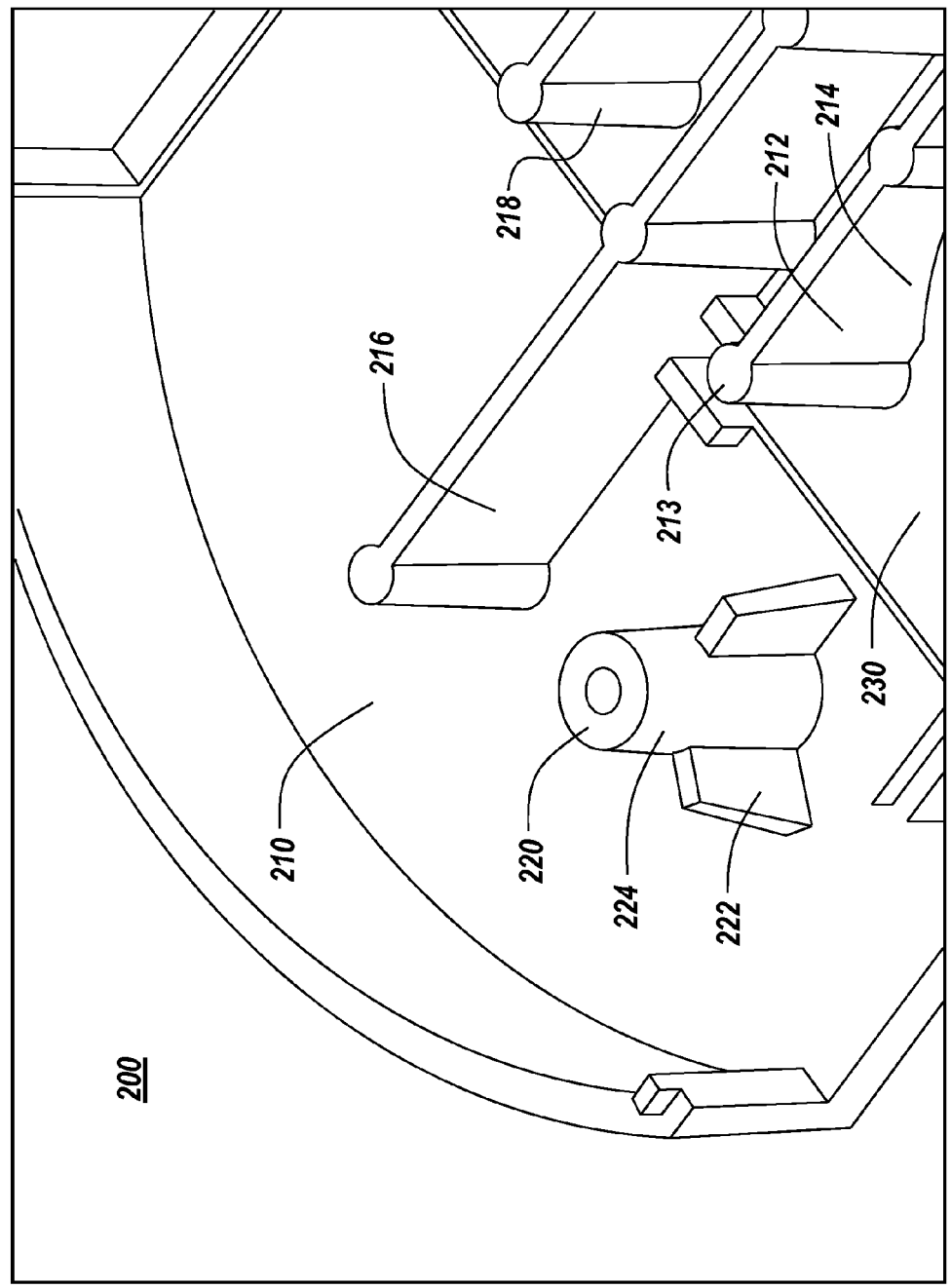
FIG. 2 depicts an exemplary model 200 suitable for use with exemplary embodiments of the invention.

In accordance with exemplary embodiments of the present invention, and as depicted in FIG. 2, a model 200 is provided in a modeling environment. The model may include one or more sets of surfaces 210, 220 that may be manipulated in the modeling environment. For example, the model 200 includes a knob 220, and the knob 220 is made up of a cylinder 224 and three fins, such as fin 222. A body 210 in the model 200 includes a groove 230. The body 210 also includes a first ridge 212, a second ridge 216, and a third ridge 218. The first ridge 212 includes a number of surfaces, such as a side surface 214 and a top surface 213.

The geometry of the model may be manipulated. These manipulations may change the amount of space that is occupied by different parts of the model, or the location or position in space of parts of the model. For example, a surface or set of surfaces may be resized, moved, rotated, or the like. Manipulations will be discussed in more detail below with respect to FIG. 5.

Figure 3:
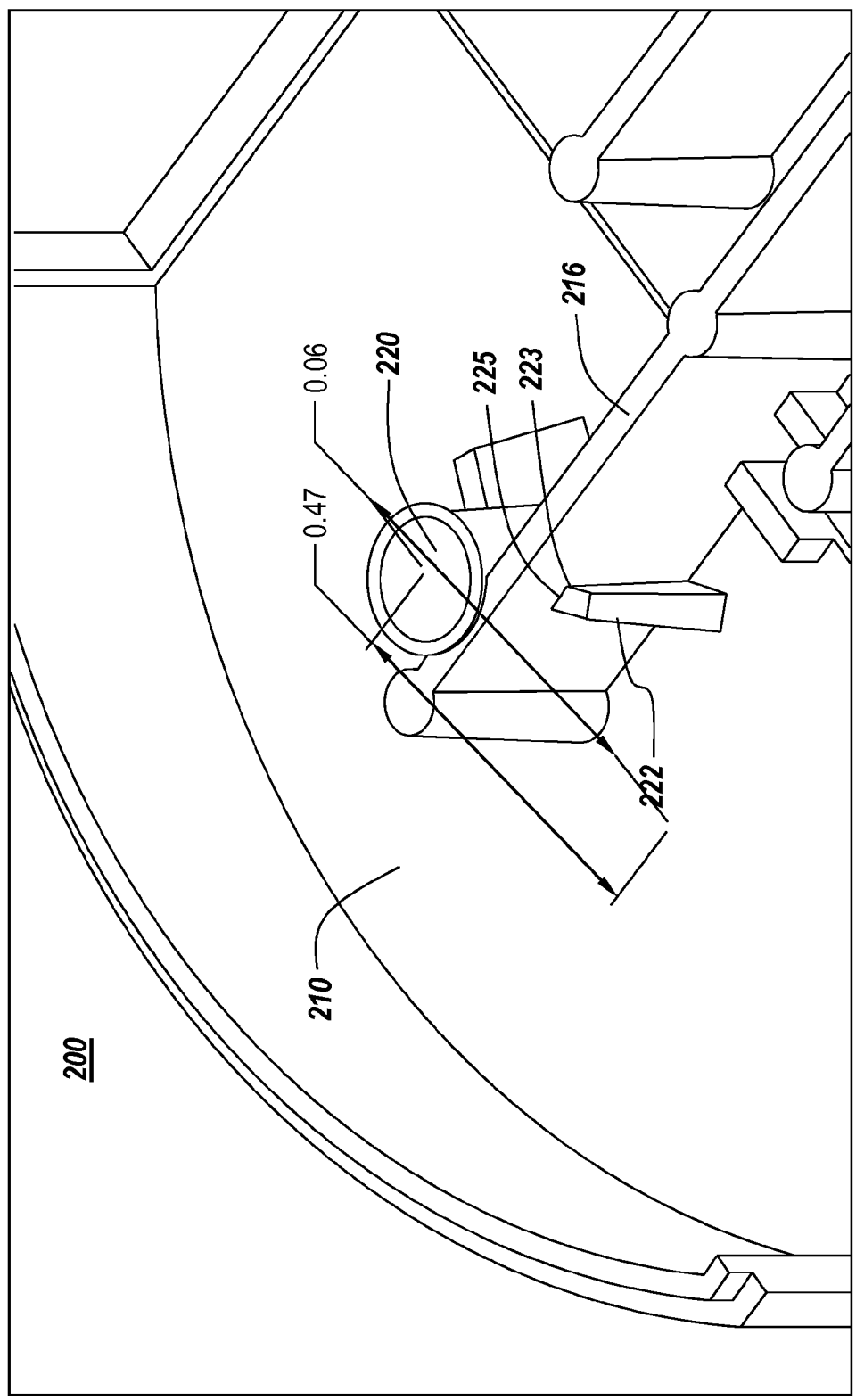
FIG. 3 depicts the model 200 after the model geometry is manipulated in such a way as to cause interference.

In some cases, the manipulation of geometry may cause interference between two or more sets of surfaces. For example, FIG. 3 depicts a model 200, which is the same as the model 200 depicted in FIG. 2 except for the manipulation of the knob 220. In FIG. 3, the knob 220 is moved so that it interferes with the middle ridge 216 of body 210. In this case, the entire model 200 is still treated as a single solid body. Accordingly, the topology for the interfering geometry (body 210 and knob 220) should be recreated so that the resulting model represents a solid body.

When a manipulation causes interference between two or more sets of surfaces, or portions of surfaces, the topology of the features are modified in accordance exemplary embodiments of the present invention to account for the interference. The modification of the topology may include a number of changes. For example, new edges, vertices, or surfaces may be created. Further, it may be possible to remove old edges, vertices, or surfaces. The modification of the topology will be discussed in more detail with respect to FIG. 5.

Although interference is discussed herein with respect to two sets of surfaces, it is understood that any number of surfaces or sets of surfaces may simultaneously interfere with each other as a result of a manipulation. As such, the present invention is by no means limited to the specific examples provided herein.

A self-intersection arises in a model when two or more features of a model intersect each other. Self-intersections may be resolved so that the intersecting features form a single, solid body.

For example, in the model 200 as depicted in FIG. 3, one of the surfaces of the fin 222 intersects the side surface of the second ridge 216. At each new point of intersection, such as a point 223 where the top and side surfaces of the fin 222 meet the side surface of the second ridge 216, a new vertex may be created for the topology. New edges may also be created between the new vertices, such as a new edge 225.

The modification of the model topology will not necessarily change the underlying sets of surfaces, such as the body 210 (which includes the second ridge 216) and the knob 220. Accordingly, although the model 200 is treated as a solid body having a unified topology, information related to the underlying interfering surfaces may be preserved. As a result, it is possible for a user to manipulate intersecting surfaces in such a way that the surfaces no longer intersect. After such a manipulation, the surfaces revert to their original topologies. For example, a user could move the knob feature 220 in the model 200 of FIG. 3 back to the position of the knob feature 220 in the model 200 of FIG. 2, and the sets of surfaces 210, 220 would revert to their original shapes and topologies.

Figure 4A:
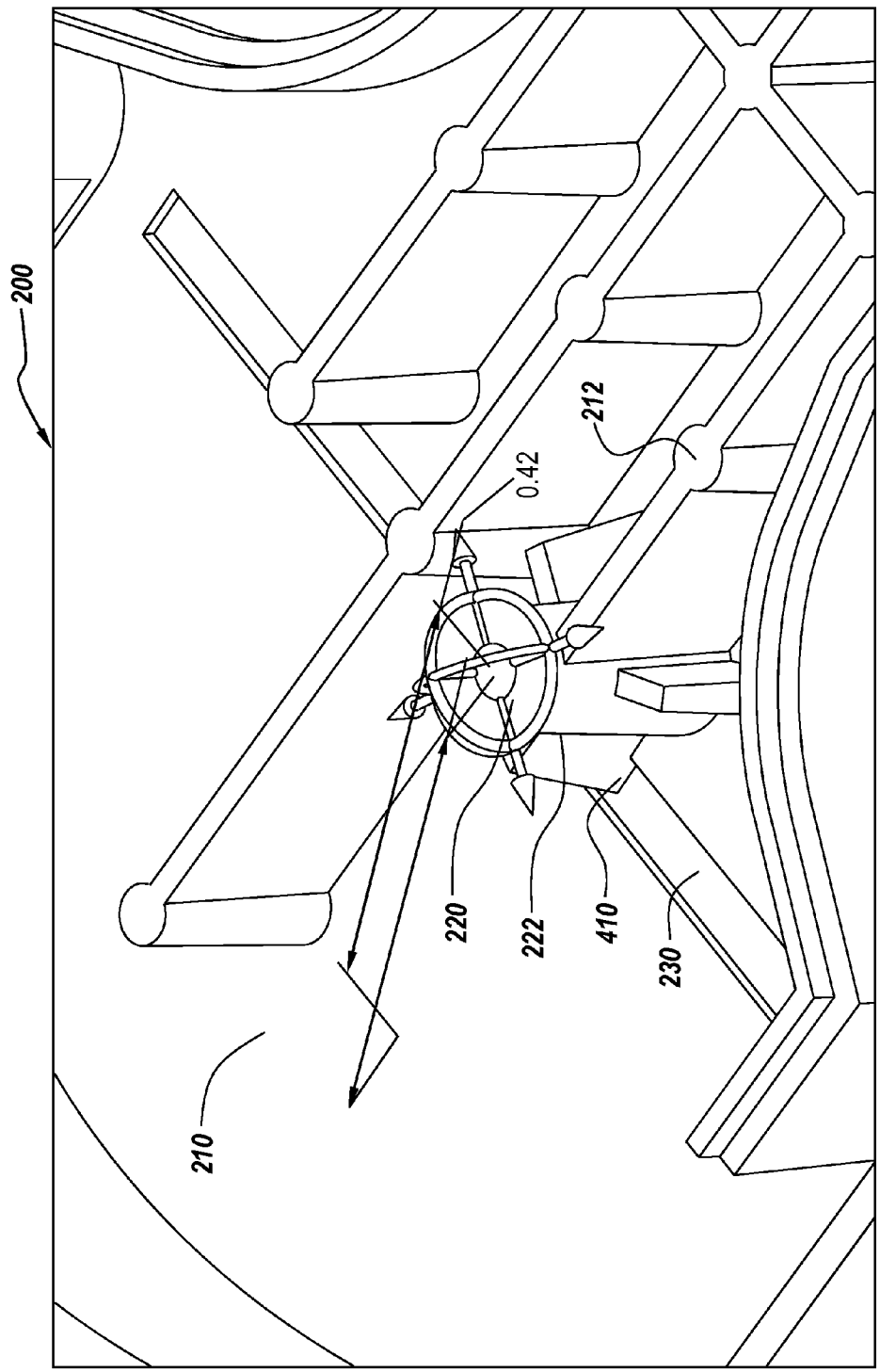
FIG. 4a depicts an exemplary manipulation of model 200 whereby the environment extends the boundaries of a surface to create a solid body.
Figure 4B:
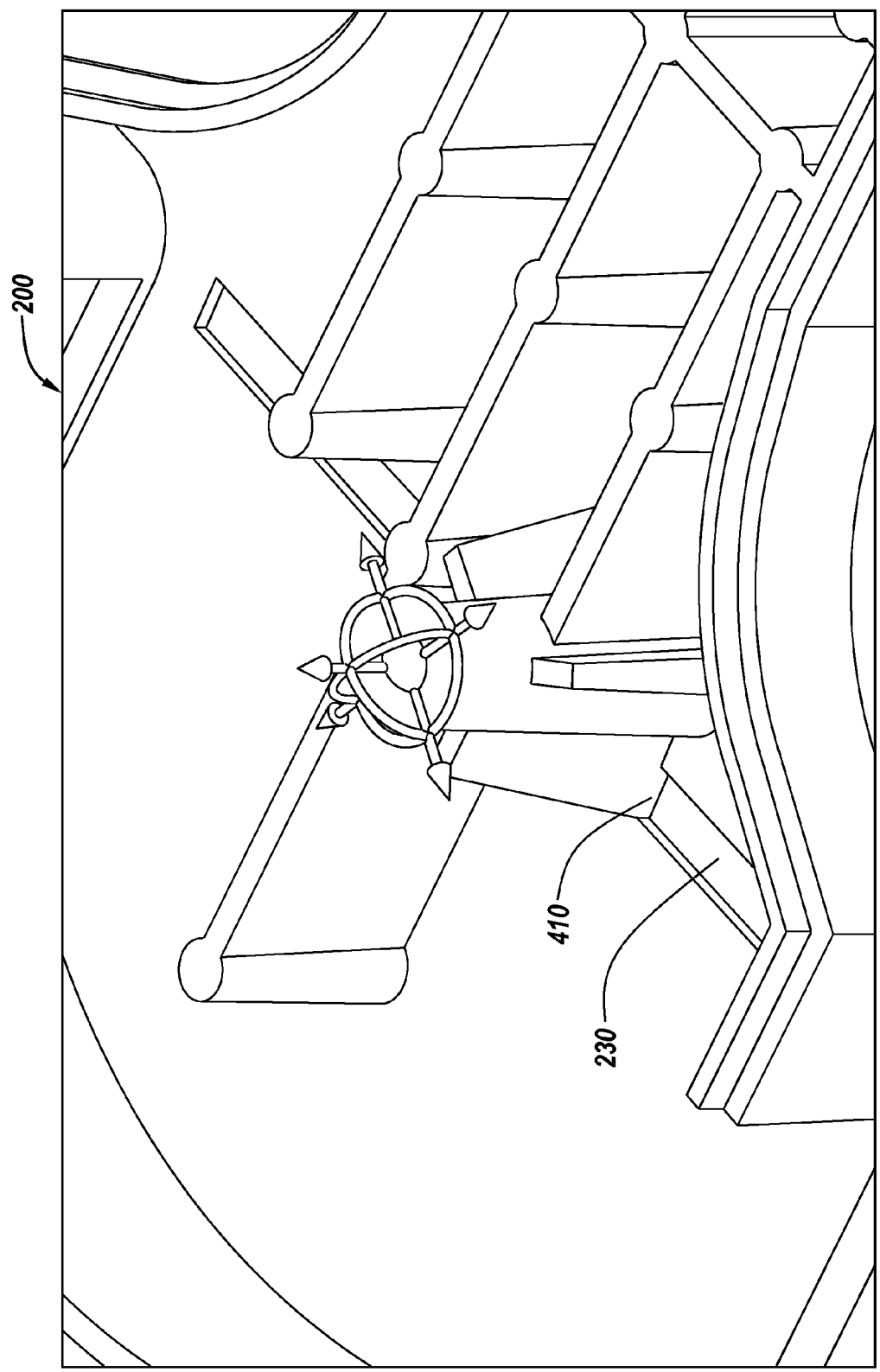
FIG. 4b depicts the model of FIG. 4a from a different perspective.

The boundaries of surfaces involved in a modification may also be extended or reduced in order to form a solid body, as depicted in FIGS. 4a and 4b. In FIG. 4a, the knob 220 has been moved so that the fin 222 sits on top of the groove 230. This may result in a space being formed between the groove 230 and the bottom of the fin 222. This empty space may present problems for the structural integrity of the model 200, and may increase the complexity and cost of manufacturing an object based on the model 200. In accordance with exemplary embodiments of the present invention, the environment may detect an empty space that results when a surface is manipulated and fill the empty space by extending one or more surfaces to fill the empty space. In some embodiments, one or more surfaces may be retracted.

For example, in FIG. 4a, the sides of the fin 222 are extended so that the bottom of the fin 222 becomes coextensive with the top of the groove 230. This eliminates the empty space between the fin 222 and the groove 230 by filling it with an extension region 410. In the present example, the extension region 410 is an extension of the fin 222. The extension region 410 is shown in more detail in FIG. 4b.

In modifying the topology, an ambiguity may arise whereby more than one option exists for the new topology. In the case of an ambiguity, the environment may provide multiple potential solutions to a user, and allow the user to select from among the solutions. For example, in the model 200 as depicted in FIGS. 4a and 4b, an alternative to lowering the bottom of the fin 222 may be to raise the top of the groove 230. A user may be presented with this option as an alternative to the model 200 as depicted in FIGS. 4a and 4b.

Figure 5:
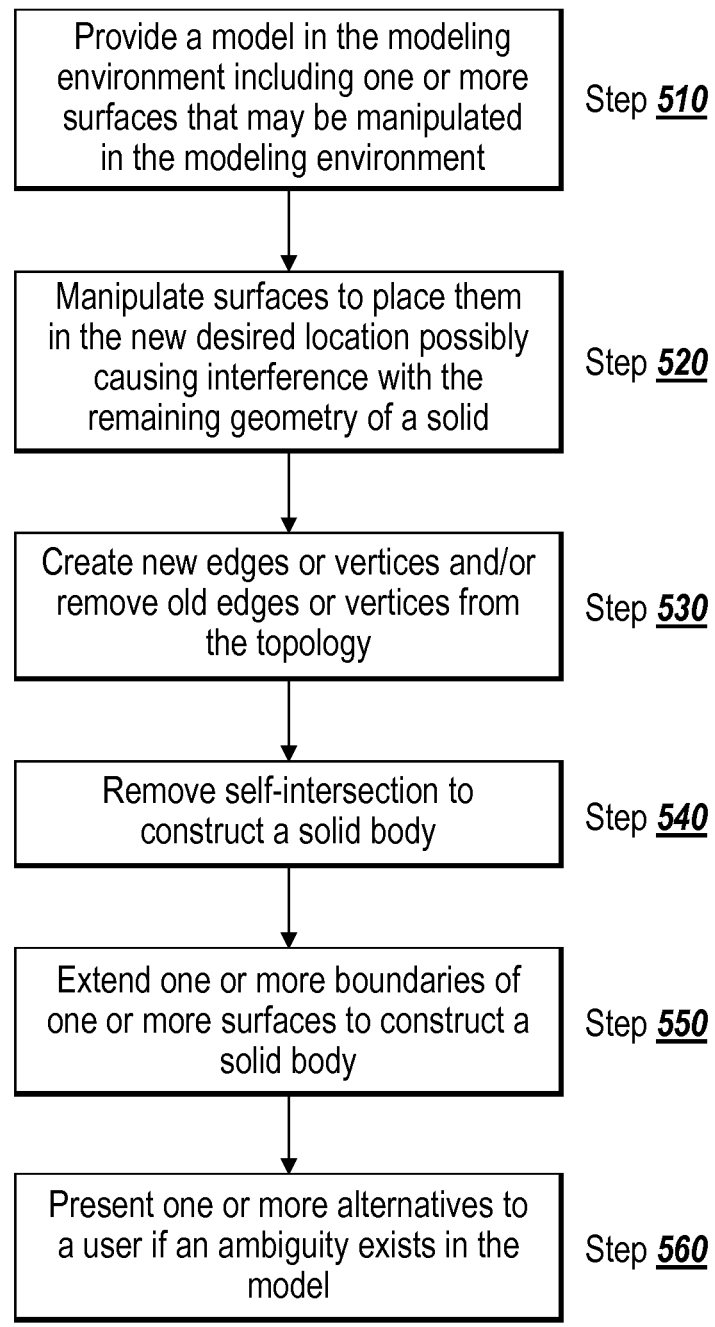
FIG. 5 is a flow chart depicting the steps performed in practicing exemplary embodiments of the invention.

FIG. 5 is a flow chart depicting the steps performed in practicing exemplary embodiments of the invention. At step 510, a model (e.g., model 200) is provided in a modeling environment, such as the modeling environment 162 depicted in FIG. 1. The model may include one or more surfaces that may be manipulated in the modeling environment.

At step 520, one or more surfaces are manipulated in such a way that the manipulation causes interference with one or more other surfaces of a solid. An "interference" indicates that one or more portions of, or all of, manipulated surfaces occupy space that is simultaneously occupied by one or more portions or all of a solid. A "manipulation" is anything that changes the location, shape, size, volume, surface area, position or space that is occupied by the feature. A manipulation may include, for example, moving, resizing, or rotating the feature. Parts of the geometry may be extruded, compressed, added to, or subtracted from to change the shape of the geometry.

The modeling environment 162, as depicted in FIG. 1, may recognize the interference. For example, the geometry kernel 166 may be tasked with identifying potential interferences during or after each manipulation of geometry. The modeling environment 162 may recognize the interference by, for example, comparing the space occupied by the interior volumes of sets of surfaces to determine whether the geometries defining those surfaces occupy at least some of the same space. In accordance with another exemplary embodiment of the present invention, the modeling environment 162 may recognize the interference by comparing each of the edges associated with a first surface involved in the interference to other surfaces involved in the interference. In another exemplary embodiment, both the volumes and the topologies (including vertices, surfaces, and edges) interfering geometries are compared. This may help to resolve interferences where the comparison of volumes provides one answer (such as "no interference"), but the comparison of topologies gives a different answer (such as "interference found"). For example, if a small sphere is moved entirely within a larger sphere, the comparison of topologies may not indicate an intersection between the topologies of the small sphere and the large sphere, because the surface area of the inner sphere does not interfere with the surface area of the outer sphere. However, the comparison of volumes indicates that the geometry corresponding to the smaller sphere occupies at least some of the same space as the geometry corresponding to the larger sphere, and so the objects interfere.

The above steps may be repeated for each group of surfaces involved in the interference. For example, if three surfaces interfere with each other, the volumes, edges, and surface areas of the first surface may be compared to the volumes, edges, and surface areas of the second and third surface. Then, the second surface may be compared to the first and third surface, and the third surface may be compared to the first and second surface.

It may be necessary to repeat these steps for each surface in a set of surfaces because the comparison of a first geometry to a second geometry may yield different results than a comparison of the second geometry to the first geometry. For example, at step 520, edges associated with a first surface may be compared to the surface area of a second surface to determine whether the surfaces intersect. Thus, in FIG. 3, the edges of the second ridge 216 of the body 210 may be compared to the surface area of the surfaces of the fin 222. At this stage, no intersection is identified, because the edges of the second ridge 216 do not intersect with any of the surfaces of the fin 222. In contrast, when the edges of the fin 222 are compared to the surfaces of the second ridge 216, the geometry kernel 166 determines that the fin 222 does intersect with the second ridge 216. At least two of the top edges of the fin 222 and two of the bottom edges of the fin 222 intersect with the side surface of the second ridge 216.

In the above example, it was assumed that the edges of the second ridge 216 do not intersect with any of the surfaces of the fin 222. However, it may be possible that the bottom face of the fin 222 intersects the bottom edges of the second ridge 216 because the bottom face of the fin 222 falls in the same plane as the bottom edges of the second ridge 216. Whether or not this is considered to be an intersection may be defined, for example, by the geometry kernel 166, and may vary depending on the implementation or application.

At steps 530-550, the topologies of the features are modified to account for the interference.

At step 530, new edges, vertices, and/or surfaces are created or extended, or old edges, vertices, and/or surfaces are removed or retracted, or both. In one exemplary embodiment, the geometry kernel 166 (FIG. 1) may analyze the surfaces or sets of surfaces involved in the interference to determine how to change the topologies. For example, the geometry kernel may determine where to place new vertices by examining points of intersection between edges and surfaces. In FIG. 3, a new vertex may be created at a point 223 because one edge of the fin 222 intersects a surface of the second ridge 216 at the point 223. Once each new vertex is identified, the geometry kernel 166 may remove vertices that will not contribute to the new topology. For example, the point at which the fin 222 intersects the cylinder 224 (not shown in FIG. 3) would have constituted a vertex in model 200 as depicted in FIG. 2. However, this point lies within the volume of the geometry corresponding second ridge 216 in the model 200 as depicted in FIG. 3. Because this point does not contribute to the topology of a new solid body resulting from the interference of the knob 220 with the second ridge 216, this vertex may be removed from the topology of model 200 as depicted in FIG. 3.

This step may be simplified by removing certain surfaces, vertices, and edges from consideration. For example, parallel surfaces will never intersect. The determination of an intersection may involve, for example, comparing the size, position, or both of two surfaces to the angle between the surfaces.

New edges may be created that account for the current set of vertices after new vertices have been created, and old edges may be removed once the old vertices are removed. New edges may be created along previously existing edges (such as the point connecting the vertex 223 in FIG. 3 with the outer vertex of the fin 222 along the existing edge). New edges may also be created where no edges previously existed, such as the edge 225 in FIG. 3. In the case where no edge previously existed, a new edge may be identified by comparing vertices to surfaces or points of intersection between features. For example, the need for an edge 225 may be identified based on the intersection of the top of the fin 222 with the side surface of the second ridge 216. Further, old edges may be removed, such as the top edges of the fin 222. The removal of old edges may be identified based on the removal of vertices, or the existence of an edge associated with a first surface that interferes with a second surface or edge associated with a second surface.

Once the new edges are created and old edges removed, new surfaces may be created and old surfaces may be removed. New surfaces may be created to connect added edges, and old surfaces may be removed based on the removal of old edges. The need for the addition or removal of surfaces may be identified in a manner similar to the addition or removal of vertices and edges. For example, a surface corresponding to a first geometry may be removed if the surface interferes with a surface corresponding to a second geometry.

At step 540, self intersections are resolved so that the intersecting surfaces form a single, solid body. After intersecting vertices, edges, or surfaces are identified at step 530, and new vertices, edges, or surfaces are created, the topologies of the interfering surfaces are merged so that the interfering surfaces are treated as a single set of surfaces, referred to herein as a "merged surface." The merged surface may correspond to a new topology. A new volume may be calculated for the geometry corresponding to the merged surface by the geometry kernel 166. The merged surface is now treated as a solid entity for purposes of the model, although each surface or set of surfaces making up the merged surface (e.g., the knob 220 and the second ridge 216) may maintain its own identity and continue to be independently manipulatable. If the individual surfaces making up the merged surface are subsequently manipulated in a way that eliminates the intersection or results in a new or different intersection, the topology and volume of a new merged surface or set of surfaces may be recalculated in the same manner as described at steps 530-550.

At step 550, the boundaries of surfaces involved in the modification may be extended or reduced in order to form a solid body. The modeling environment 162 may maintain a set of rules governing how to form a solid body in the model. For example, a particular part of the model may be identified as the base of the model, such as the base 210 in the model 200. If a part of the model is identified as a base, an exemplary rule for maintaining a solid body may be to require that the bottom of each set of surfaces placed on the base 210 should be as coextensive as possible with the base 210. Alternatively, an exemplary rule may be to eliminate space between the sides of the base 210 and the side surfaces of geometries placed on the base 210. Another exemplary rule may be to eliminate empty spaces between each various parts of the model. The modeling environment 162 may include default rules in addition to user-defined rules.

If more than one option is possible in steps 530-550, an ambiguity exists as to which option should be chosen. An ambiguity may exist when the resolution of an interference may be done in more than one way. For example, when more than one surface may be extended to form a solid body at step 550, an ambiguity may exist as to which surface to extend (a first surface, a second surface, or both surfaces). For example, in FIG. 4a, the extension area 410 may be an extension of the surfaces of the fin 222 or may be an extension of the groove 230, or the surfaces of both the fin 222 and the groove 230 may be extended. When an ambiguity exists, the modeling environment 162 may rely on a default rule for resolving the ambiguity. One example of a default rule is to modify the topology, volume, or both, of the geometry whose manipulation gave rise to the interference. For example, because the knob 220 was moved on top of the groove 230 in FIG. 4a, the manipulation of the knob 220 gave rise to the interference. Thus, the extension region 410 is added to the knob 220 and not the groove 230. Another example of a default rule is to preserve the shape of the base 210 and require that extension regions be added to geometries placed on top of a base feature. One having ordinary skill in the art will understand that the choice of a default rule may be overridden by a user-defined rule, and that the default rule may vary depending on the application or situation.

Optionally, at step 560, the ambiguity may be resolved by presenting each potential option to a user, who may select one of the options for implementation. The plurality of options may be presented to a user in a graphical user interface that is displayed on a display device, such as the display device 130 in FIG. 1. The selected option may then be implemented in the model.

Although the present invention has been described with reference to particular embodiments, one having ordinary skill in the art will understand that the present invention is not limited to the embodiments described herein. A number of modifications are possible without deviating from the scope of the invention. The preset invention is meant to cover all such modifications.

The invention claimed is:

1. A method performed in an electronic device, the method comprising:
   providing a model in a modeling environment, the model comprising a base and a plurality of surfaces, at least some of the surfaces being positioned on the base;
   manipulating a geometry of the model so that at least a portion of two or more surfaces of the plurality of surfaces occupy a same space to create an interference;
   programmatically detecting the interference;
   in response to detecting the interference, resolving, using a processor of the electronic device, the interference so that the model comprises a solid body with a unitary geometry, the resolving comprising:
      detecting an empty space between one or more surfaces of the surfaces positioned on the base and the base of the model resulting from the manipulation,
      extending the one or more surfaces of the surfaces positioned on the base to make the one or more surfaces coextensive with the base so that the model comprises the solid body with the unitary geometry and
   storing the resulting model in storage.

2. The method of claim 1, wherein resolving the interference comprises adding at least one of the group of a new vertex, a new surface, and a new edge to create a solid body.

3. The method of claim 1, wherein a plurality of options exist for resolving the interference, the plurality of options being presented to a user through a graphical user interface on a display, the graphical user interface allowing a user to select one of the plurality of options, the selected option being implemented in the model.

4. The method of claim 1, wherein the geometry comprises a first feature and manipulating the geometry comprises manipulating the first feature by at least one of the group of moving, resizing, or rotating the first feature.

5. The method of claim 1, wherein resolving the interference is performed at least in part by a geometry kernel provided by the electronic device.

6. The method of claim 1, wherein the manipulation comprises moving one or more of the plurality of surfaces independently of the unitary geometry while the one or more of the plurality of surfaces participates in the unitary geometry.

7. A non-transitory electronic-device-readable medium storing electronic-device-readable instructions that, when executed by a processor, cause the processor to:
   provide a model in a modeling environment, the model comprising a base and a plurality of surfaces, at least some of the surfaces being positioned on the base;
   manipulate a first surface of the plurality of surfaces so that at least a portion of the first surface occupies a same space as at least a portion of a second surface of the plurality of surfaces to create an interference;
   in response to detecting the interference, resolve the interference so that the model comprises a solid body with a unitary geometry, the resolving comprising:
      detecting an empty space between one or more surfaces of the surfaces positioned on the base and the base of the model resulting from the manipulation,
      extending the one or more surfaces of the surfaces positioned on the base to make the one or more surfaces coextensive with the base so that the model comprises the solid body with the unitary geometry and
   store the resulting model in storage.

8. A system comprising:
   storage for storing a model, the model comprising a base and a plurality of surfaces, at least some of the surfaces being positioned on the base; and
   a processor for:
      providing a modeling environment that allows for the manipulation of one or more of the surfaces of the plurality of surfaces of the model;
      detecting the interference;
      in response to detecting the interference, resolving an interference between a first surface in the model and a second surface in the model caused by at least a portion of the first surface and at least a portion of the second surface occupying a same space so that the model forms a solid body with a unitary geometry, the resolving comprising:
         detecting an empty space between one or more surfaces of the surfaces positioned on the base and the base of the model resulting from the manipulation,
         extending the one or more surfaces of the surfaces positioned on the base to make the one or more surfaces coextensive with the base so that the model comprises the solid body with the unitary geometry and
      storing the resulting model in the storage.

* * * * *